United States Patent
Chou et al.

(10) Patent No.: US 10,204,822 B2
(45) Date of Patent: Feb. 12, 2019

(54) METHOD FOR FORMING TRENCH LINER PASSIVATION

(71) Applicant: TAIWAN SEMICONDUCTOR MANUFACTURING CO., LTD., Hsinchu (TW)

(72) Inventors: Cheng-Hsien Chou, Tainan (TW); Hung-Ling Shih, Tainan (TW); Tsun-Kai Tsao, Tainan (TW); Ming-Huei Shen, Yunlin County (TW); Kuo-Hwa Tzeng, Taipei (TW); Yeur-Luen Tu, Taichung (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/884,304

(22) Filed: Jan. 30, 2018

(65) Prior Publication Data
US 2018/0174888 A1    Jun. 21, 2018

Related U.S. Application Data

(62) Division of application No. 13/930,189, filed on Jun. 28, 2013, now Pat. No. 9,917,003.

(51) Int. Cl.
*H01L 21/02* (2006.01)
*H01L 21/762* (2006.01)

(52) U.S. Cl.
CPC ...... *H01L 21/76224* (2013.01); *H01L 21/022* (2013.01); *H01L 21/0217* (2013.01); *H01L 21/02219* (2013.01); *H01L 21/02211* (2013.01)

(58) Field of Classification Search
CPC .......... H01L 21/76224; H01L 21/0331; H01L 21/0332; H01L 21/022
See application file for complete search history.

(56) References Cited

U.S. PATENT DOCUMENTS 5,976,951 A * 11/1999 Huang .............. H01L 21/76232
  148/DIG. 50
6,017,780 A *  1/2000 Roy ................... G02F 1/136227
  257/E21.244

(Continued)

OTHER PUBLICATIONS

Ren, et al., "Charge Stability in LPCVD Silicon Nitride for Surface Passivation of Silicon Solar Cells", Photovoltaic Spec. Conf. (PVSC), 2010, pp. 000897-000901.*

(Continued)

*Primary Examiner* — Yu Chen
*Assistant Examiner* — Vincent Wall
(74) *Attorney, Agent, or Firm* — Maschoff Brennan (57) ABSTRACT

In a method for fabricating a semiconductor device, a trench is etched in a semiconductor substrate having a top surface, and a lining oxide layer is formed conformal to the trench. A negatively-charged liner covering the lining oxide layer and conformal to the trench is formed. The trench is partially filled with a flowable oxide to a level below the top surface of the semiconductor substrate, and the flowable oxide in the trench is cured. The negatively-charged liner above the cured flowable oxide is optionally removed. A silicon oxide is deposited in the remaining portion of the trench, and a planarization process is performed to remove excess portions of the silicon oxide over the top surface of the semiconductor substrate.

20 Claims, 11 Drawing Sheets

(56) References Cited

U.S. PATENT DOCUMENTS

| | | | |
|---|---|---|---|
| 6,342,428 B1* | 1/2002 | Zheng | H01L 21/0332 216/64 |
| 6,596,607 B2 | 7/2003 | Ahn | |
| 7,575,981 B2* | 8/2009 | Lee | H01L 21/76232 257/E21.546 |
| 8,652,931 B1 | 2/2014 | Luo | |
| 2002/0093041 A1 | 7/2002 | Hong | |
| 2004/0005781 A1* | 1/2004 | Huang | H01L 21/02164 438/694 |
| 2005/0116312 A1* | 6/2005 | Lim | H01L 21/76229 257/499 |
| 2005/0151218 A1 | 7/2005 | Mouli | |
| 2006/0223280 A1* | 10/2006 | Ueda | H01L 21/76224 438/435 |
| 2012/0149172 A1* | 6/2012 | Huang | H01L 21/76227 438/437 |
| 2014/0048897 A1* | 2/2014 | Qian | H01L 27/1463 257/431 |

OTHER PUBLICATIONS

Ren, Y. et al., "Charge Stability in LPCVD Silicon Nitride for Surface Passivation of Silicon Solar Cells", Photovoltaic Specialists Conference (PVSC), 2010, pp. 897-901.

* cited by examiner

METHOD FOR FORMING TRENCH LINER PASSIVATION

PRIORITY CLAIM AND CROSS-REFERENCE

This is a divisional application of U.S. patent application Ser. No. 13/930,189 filed on Jun. 28, 2013, which is incorporated herein by reference in its entirety.

BACKGROUND

Generally, shallow trench isolations (STIs) are used to separate and isolate active areas, such as transistors and photo diodes, on a semiconductor wafer from each other. The STIs are formed by etching trenches, forming silicon oxide liners in the trenches, overfilling the trenches with a dielectric such as an oxide, and then removing any excess dielectric outside the trenches. This dielectric helps to electrically isolate the active areas from each other. For fabricating a complementary metal-oxide-semiconductor (CMOS) image sensor (CIS) which has a low tolerance for the leakage of signal between photodiodes, a field implantation is further used after the formation of silicon oxide liners. In the overfilling operation, high-density plasma (HDP) chemical vapor deposition (CVD) is typically used for filling a HDP oxide in the trenches. However, the field implantation and the HDP CVD, as well as the trench etching, often cause plasma damages to sidewalls and bottoms of the trenches. Such plasma damages are the sources resulting in dark current, which is the cause of the "white pixel" defect in a CIS.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable concepts that can be embodied in a wide variety of specific contexts. The specific embodiments discussed are merely illustrative of specific ways to make and use the disclosed subject matter, and do not limit the scope of the different embodiments. The present disclosure may repeat reference numerals and/or letters in the various examples. This repetition is for the purpose of simplicity and clarity and does not in itself dictate a relationship between the various embodiments and/or configurations discussed.

Embodiments of the present disclosure provide trench isolation designs for semiconductor devices (such as image sensors or logic devices) to isolate components in these devices from each other and to prevent, or at least minimize, current leakage. In the formation process of a trench isolation, an opening is first formed in a semiconductor substrate. A silicon oxide liner is formed in the opening, followed by a gap filling process to fill the remaining portion of the opening with a dielectric material and a chemical mechanical polish (CMP) to remove excess portions of the dielectric material. The portions of the dielectric material and the silicon oxide liner that are left in the openings thus form the trench isolation. In some techniques, for increasing isolation, a field implantation is performed to implant dopants into the dielectric material. However, the field implantation causes plasma damages to semiconductor substrate, and hence the leakage-prevention ability is adversely affected.

According to various embodiments of the present disclosure, a trench isolation that provides better passivation without using an implantation process is disclosed. The trench isolation includes a negatively-charged liner around a dielectric material, which is surrounded by a lining oxide layer. The negatively-charged liner traps negative charges, and the negative charges increase hole accumulation at an interface of the lining oxide layer and the semiconductor substrate, thus forming a hole accumulation layer in the trench isolation for increasing passivation. Thus, the field implantation used in some techniques for increasing isolation is not needed. In some embodiments, the trench isolation has two portions: a flowable oxide filled lower portion and an HDP oxide filled top portion. Because plasma damages can cause dark current, embodiments of the present disclosure can reduce the dark current by not using the aforementioned field implantation. The dark current is current flowing in the image sensor device when no incident light enters the image sensor device. The dark current is the cause of a "white pixel" defect in the image sensor device, i.e., a pixel that always outputs a large signal due to high dark current.

Figure 1A:
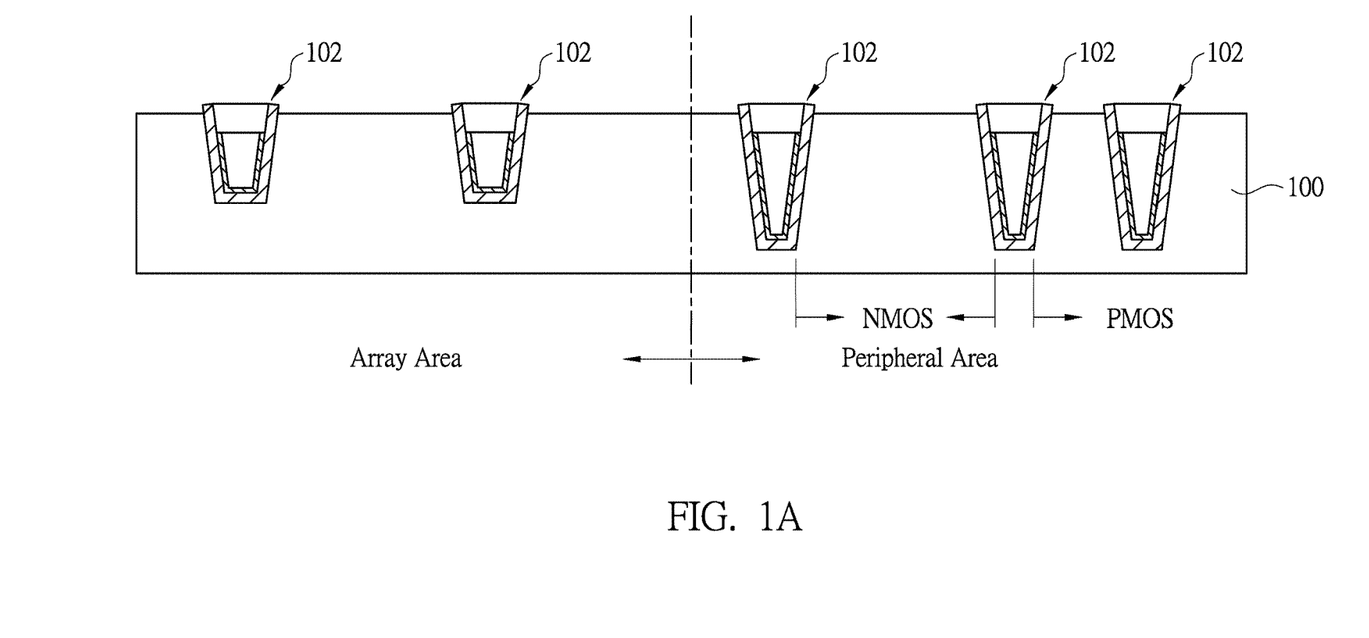
FIG. 1A-FIG. 1E are schematic cross-sectional views of semiconductor devices for various embodiments.

FIG. 1A-FIG. 1E are schematic cross-sectional views showing a semiconductor device for various embodiments. As shown in FIG. 1A, trench isolations 102 are formed in a semiconductor substrate 100. Some trench isolations 102 are STIs used to separate and isolate photo diodes in an array area, and some trench isolations 102 are deep trench isolations used to separate and isolate NMOS and PMOS devices in a peripheral area. The structures and materials of the STI and the deep trench isolation are the same except depth.

Figure 1B:
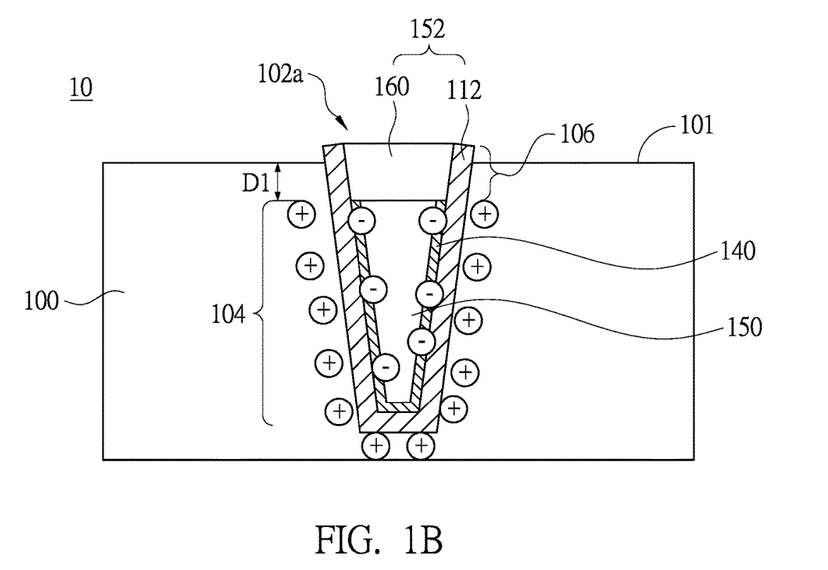

As shown in FIG. 1B, a semiconductor device 10 includes semiconductor substrate 100 and a trench isolation 102a. In some embodiments, the semiconductor substrate 100 is a silicon substrate. Other commonly used materials, such as carbon, germanium, gallium, arsenic, nitrogen, indium, phosphorus, and/or the like, may also be included in the semiconductor substrate 100. The semiconductor substrate 100 may be formed of a single-crystalline semiconductor material or compound semiconductor materials, and may be a bulk substrate or a semiconductor-on-insulator (SOI) substrate. The trench isolation 102a, such as a STI or a deep trench isolation, is used to separate and isolate photo diodes when the semiconductor device 10 is an image sensor, and is used to separate and isolate transistors when the semiconductor device 10 is a logic device. The trench isolation 102a is mainly formed by depositing dielectric materials in a trench etched in the semiconductor substrate 100.

The trench isolation 102a includes a bottom portion 104 and a top portion 106 adjoining the bottom portion 104. The bottom portion 104 is spaced from a top surface 101 of the semiconductor substrate 100 at a distance D1, and the top portion 106 extends from the bottom portion 104 to or through the top surface 101 of the semiconductor substrate 100. In some embodiments, the distance D1 ranges from about 100 Angstroms to about 1000 Angstroms. The bottom portion 104 has a lining oxide layer 112, a negatively-charged liner 140 and a first silicon oxide 150. The lining oxide layer 112 is conformal to the trench in the semiconductor substrate 100, and is peripherally enclosed by the semiconductor substrate 100. The negatively-charged liner 140 overlies the lining oxide layer 112 in a lower part of the trench, and is peripherally enclosed by the lining oxide layer 112. The first silicon oxide 150 fills the lower part of the trench, and is peripherally enclosed by the negatively-charged liner 140. The top portion 106 has a second silicon oxide 152. The second silicon oxide 152 includes the lining oxide layer 112 and a silicon oxide filler 160 in an upper part of the trench, and is peripherally enclosed by and contacts the semiconductor substrate 100. The silicon oxide filler 160 may be a silicon oxide deposited using a high density plasma (HDP) chemical vapor deposition (CVD) process and referred to herein as an HDP oxide 160.

In the lower portion 104, the negatively-charged layer 140 traps negative charges and has a total negative charge smaller than about $-50E10/cm^2$, for example, about $-100E10/cm^2$ or $-400E10/cm^2$. In some embodiments, the negatively-charged liner 140 is a high-k dielectric material or a silicon nitride material. The high-k dielectric material may be, for example, aluminum oxide, magnesium oxide, calcium oxide, hafnium oxide, hafnium silicon oxide, hafnium silicon oxynitride, zirconium oxide, yttrium oxide, tantalum oxide, strontium oxide, titanium oxide, lanthanum oxide, barium oxide, or combinations thereof. The silicon nitride material may be, for example, negatively-charged silicon nitride. In some embodiments, reaction gas of silane ($SiH_4$) and ammonia ($NH_3$) are used to make negatively-charged silicon nitride, in which the increase of NH3 will make silicon nitride become negatively charged. The electrical property of the negatively-charged silicon nitride can be measured by Quantox measurement. For better dark current performance, the thickness of the negatively-charged liner 140 has to be greater than or equal to about 5 Angstroms. In general, a thicker negatively-charged liner 140 results in better dark current performance of the semiconductor device 10. However, the thickness of the negatively-charged liner 140 has less affect on the improvement of the dark current performance of the semiconductor device 10 when reaching a certain value of thickness. In some embodiments, the negatively-charged liner 140 has a thickness ranging from about 5 Angstroms to about 100 Angstroms. The negative charges in the negatively-charged liner 140 improve in the passivation of the trench isolation. Accordingly, because of the presence of the negative charges, holes accumulate from the semiconductor substrate 100 around the lower portion 104, effectively forming a passivation layer of negative charges and holes between adjacent active regions. The passivation layer replaces field implantation of the isolation dielectric used in some techniques to improve the passivation performance of trench isolators. Thus, the current leakage caused by such field implantation can be avoided.

The first silicon oxide 150 is deposited in the lower part of the trench by first depositing a flowable oxide and converting the flowable oxide to silicon oxide. The flowable oxide is deposited using a spin on glass (SOG) or flowable chemical vapor deposition (FCVD) process. Unlike the HDPCVD process, the SOG process and the FCVD process do not damage the semiconductor substrate 100 (the sidewall and bottom of the trench). Thus, the current leakage caused by the HDPCVD process can be avoided. On the other hand, the negatively-charged liner 140 is totally covered by the HDP oxide 160 and is not exposed from the trench isolation 102a, and thus metal contaminations due to exposed high-k dielectric in the subsequent processes can be avoided.

In the top portion 106, the HDP oxide 160 fills an upper part of the trench. Because the lower part of the trench has been filled with the flowable oxide, the remaining space of the trench to be filled with the HDP oxide 160 is reduced. In other words, the remaining space in the upper part of the trench has a lower aspect ratio than the whole trench. Filling the upper part of the trench with a HDPCVD process is therefore easier than filling the whole trench with a HDPCVD process. In one example, the HDP oxide 160 can be deposited using a low power HDPCVD process to avoid plasma damages.

Figure 1C:
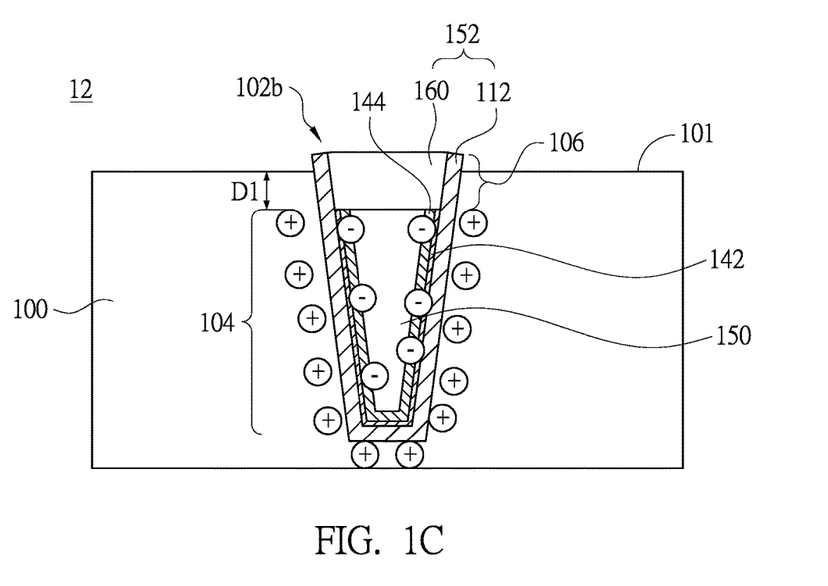

In certain embodiments, as shown in FIG. 1C, a semiconductor device 12 includes semiconductor substrate 100 and a trench isolation 102b. In contrast to the negatively-charged liner 140 of the trench isolation 102a shown in FIG. 1B, a corresponding negatively-charged liner of the trench isolation 102b includes a negative charge liner 142 and a high-K dielectric liner 144. The negative charge liner 142 overlies the lining oxide layer 112 in the lower part of the trench, and is peripherally enclosed by the lining oxide layer 112. The high-K dielectric liner 144 overlies the negative charge liner 142, and is enclosed by the negative charge liner 142. In some embodiments, the negative charge liner 142 is negatively-charged silicon nitride, and the high-K dielectric liner 144 is aluminum oxide or hafnium oxide. In some embodiments, the high-k dielectric liner 144 may be, for example, magnesium oxide, calcium oxide, hafnium silicon oxide, hafnium silicon oxynitride, zirconium oxide, yttrium oxide, tantalum oxide, strontium oxide, titanium oxide, lanthanum oxide, barium oxide, or combinations thereof. In some embodiments, the total thickness of the negative charge liner 142 and the high-k dielectric liner 144 is greater than or equal to about 5 Angstroms. In certain embodiments, the total thickness of the negative charge liner 142 and the high-k dielectric liner 144 is in a range from about 5 Angstroms to about 100 Angstroms. Both of the negative charge liner 142 and the high-K dielectric liner 144 of the trench isolation 102b are totally covered by the HDP oxide 160 and are not exposed from the trench isolation 102b, thereby preventing metal contaminations due to exposed high-k dielectric in the subsequent processes.

Figure 1D:
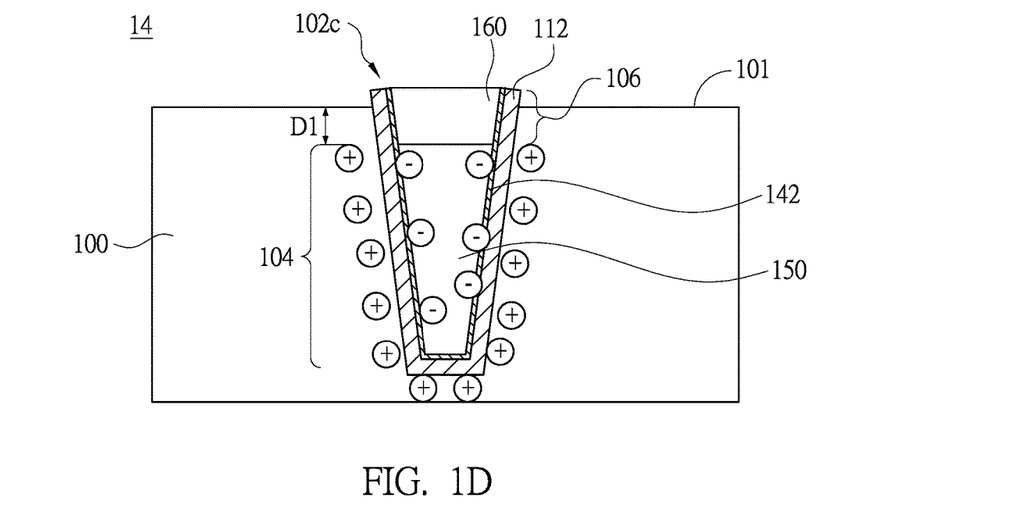

In certain embodiments, as shown in FIG. 1D, a semiconductor device 14 includes semiconductor substrate 100 and a trench isolation 102c. In contrast to the negatively-charged liner 140 of the trench isolation 102a shown in FIG. 1A, a corresponding negatively-charged liner of the trench isolation 102c includes only the negative charge liner 142. In some embodiments, the negative charge liner 142 is negatively-charged silicon nitride. In some embodiments, the thickness of the negative charge liner 142 is greater than or equal to about 5 Angstroms. In certain embodiments, the thickness of the negative charge liner 142 is in a range from about 5 Angstroms to about 100 Angstroms. In the trench isolation 102c, the lining oxide layer 112 is conformal to the trench in the semiconductor substrate 100, and is peripherally enclosed by the semiconductor substrate 100. The negatively-charged liner 140 is peripherally enclosed by the lining oxide layer 112. The first silicon oxide 150 fills the lower part of the trench, and is peripherally enclosed by the negatively-charged liner 140. The top portion 106 has a second silicon oxide. The second silicon oxide includes a silicon oxide filler 160 in an upper part of the trench, and is peripherally enclosed by the negative charge liner 142. The silicon oxide filler 160 may be an HDP oxide 160. Because the exposed negatively-charged silicon nitride does not cause metal contaminations in the subsequent processes, the negative charge liner 142 can be exposed from the trench isolation 102c.

Figure 1E:
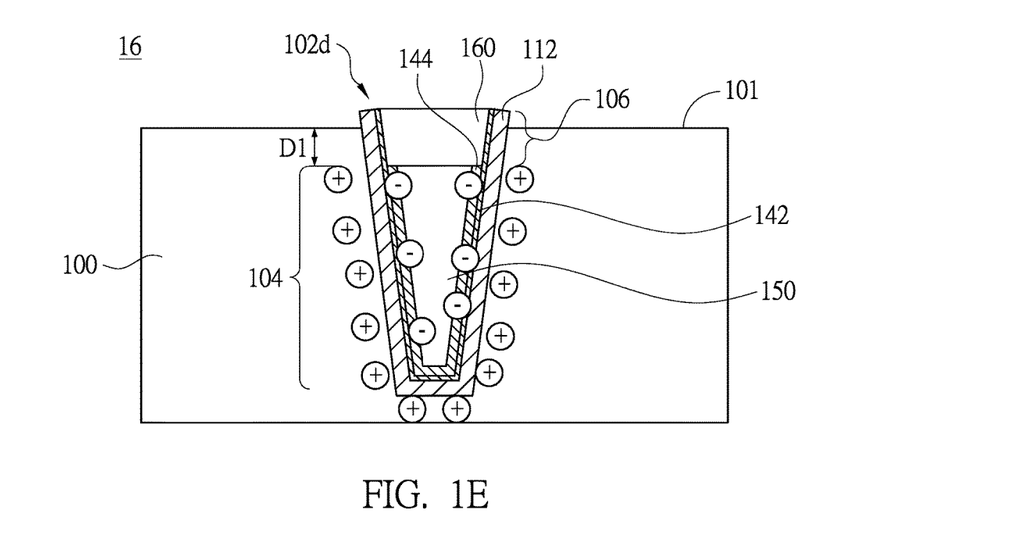

In certain embodiments, as shown in FIG. 1E, a semiconductor device 16 includes semiconductor substrate 100 and a trench isolation 102d. In contrast to the negative charge liner 142 and the high-K dielectric liner 144 of the trench isolation 102c shown in FIG. 1C, in the trench isolation 102d, the negative charge liner 142 overlies the lining oxide layer 112 in the trench, and is peripherally enclosed by the lining oxide layer 112. The high-K dielectric liner 144 overlies the negative charge liner 142, and is enclosed by the negative charge liner 142. In some embodiments, the negative charge liner 142 is negatively-charged silicon nitride, and the high-K dielectric liner 144 is aluminum oxide or hafnium oxide. In some embodiments, the high-k dielectric liner 144 may be, for example, magnesium oxide, calcium oxide, hafnium silicon oxide, hafnium silicon oxynitride, zirconium oxide, yttrium oxide, tantalum oxide, strontium oxide, titanium oxide, lanthanum oxide, barium oxide, or combinations thereof. In some embodiments, the total thickness of the negative charge liner 142 and the high-k dielectric liner 144 is greater than or equal to about 5 Angstroms. In certain embodiments, the total thickness of the negative charge liner 142 and the high-k dielectric liner 144 is in a range from about 5 Angstroms to about 100 Angstroms. In the trench isolation 102d, the first silicon oxide 150 fills the lower part of the trench, and is peripherally enclosed by the negatively-charged liner 140. The top portion 106 has a second silicon oxide. The second silicon oxide includes a silicon oxide filler 160 in an upper part of the trench, and is peripherally enclosed by the negative charge liner 142. The silicon oxide filler 160 may be an HDP oxide 160. Because the exposed negatively-charged silicon nitride does not cause metal contaminations in the subsequent processes, the negative charge liner 142 can be exposed from the trench isolation 102d.

Figure 2A:
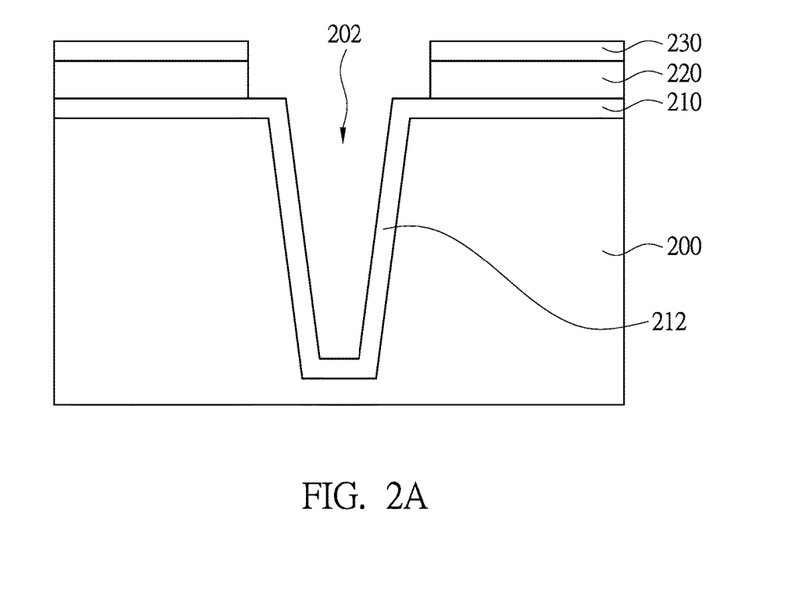
FIG. 2A-FIG. 2F are schematic cross-sectional views of intermediate stages showing a method for fabricating a semiconductor device in accordance with some embodiments.

FIG. 2A-FIG. 2F are schematic cross-sectional views of intermediate stages showing a method for fabricating a semiconductor device in accordance with some embodiments. As shown in FIG. 2A, a semiconductor substrate 200 is provided, and a pad oxide layer 210, a silicon nitride layer 220 and a silicon-rich oxide (SRO) layer 230 are sequentially stacked on the semiconductor substrate 200. After the semiconductor substrate 200 is etched to form a trench 202 (such as by using a dry etching, wet etching, or combinations thereof), a lining oxide layer 212 is formed conformal to the trench 202 and adjoins the pad oxide layer 210. In some embodiments, the lining oxide layer 212 is formed using an in-situ steam generation (ISSG) tool by annealing the substrate at about 1100° C. in the presence of steam for about two hours.

Figure 2B:
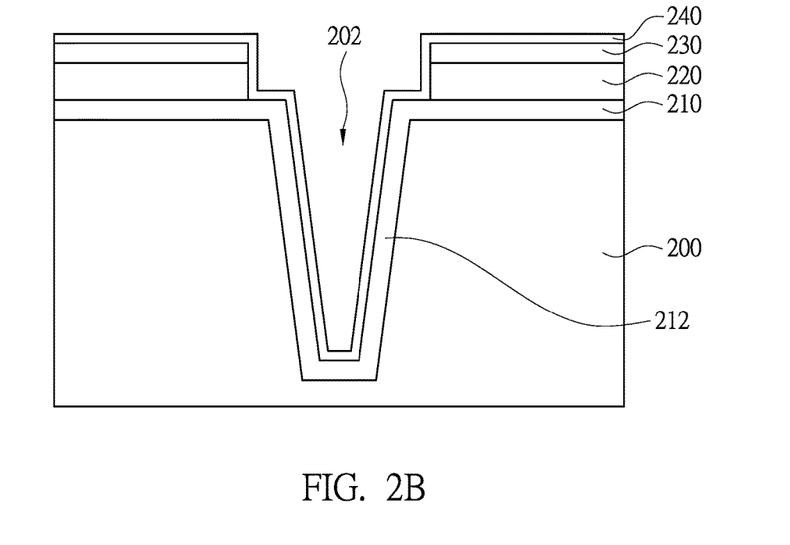

As shown in FIG. 2B, a negatively-charged liner 240 is formed conformal to the trench 202 and covers the lining oxide layer 212, the silicon nitride layer 220 and the SRO layer 230. In some embodiments, the negatively-charged liner 240 is a high-k dielectric material or a nitride material, and is formed using a deposition technique that can form conformal dielectric layers, such as a low temperature plasma assisted radical oxidation process, an atomic layer deposition process, or a plasma-assisted nitridation process.

Figure 2C:
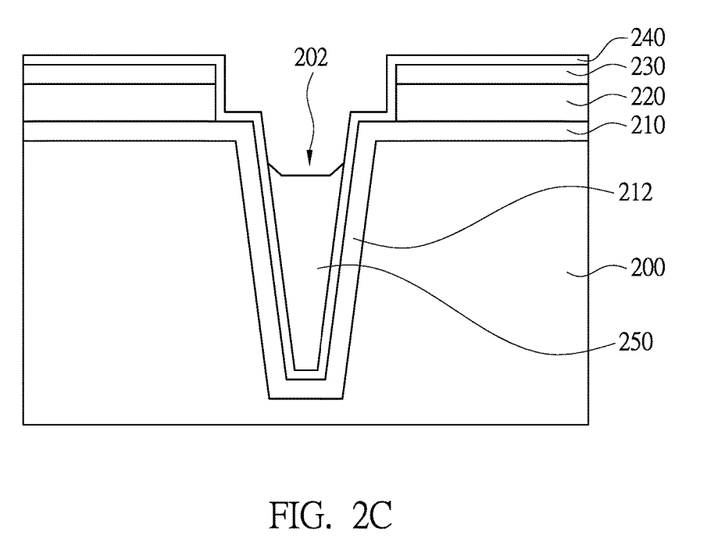

As shown in FIG. 2C, the trench 202 is partially filled with a flowable oxide 250 to a level below a top surface of the semiconductor substrate 200. For example, a SOG or FCVD process is performed for partially filling the trench 202 with the flowable oxide 250, in which the deposited amount of the flowable oxide 250 is not sufficient to fill the trench 202. For instance, in the trench 202 with 1500 Angstroms depth, the deposition thickness of the flowable oxide 250 is controlled to be about 500-1000 Angstroms. The advantage of partially filling the trench 202 with the flowable oxide is to avoid plasma damages caused by the HDPCVD process, and leave a smaller space of the trench to be filled with a HDP oxide. After being deposited in the trench 202, the flowable oxide 250 is cured at a temperature ranging from about 600° C. to about 1000° C., to convert the flowable oxide to silicon oxide.

Figure 2D:
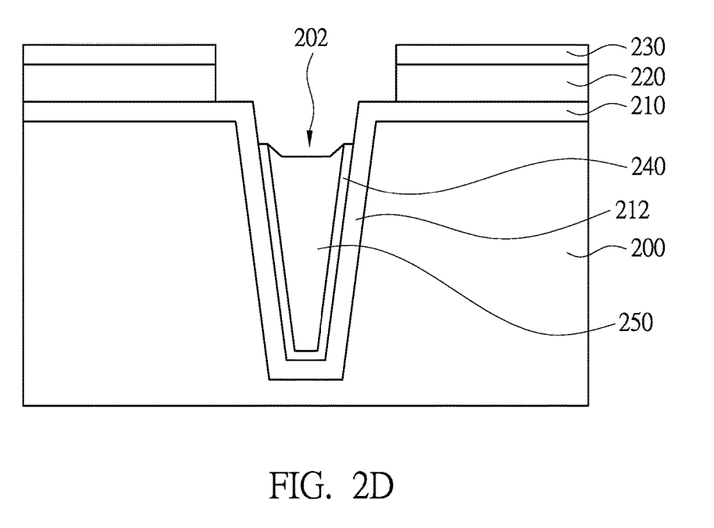

As shown in FIG. 2D, the negatively-charged liner 240 above a surface of the cured flowable oxide 250 is removed, for example, by selectively etching. The operation of selectively etching can be performed using a dry etching, wet etching, or combinations thereof. The dry etching may involve an etching gas such as boron trichloride in argon. The flowable oxide 250 acts as an etch mask and protects the negatively-charged liner 240 around it from being etched. After the selectively etching, the negatively-charged liner 240 only exists in a lower part of the trench 202, and is covered by the cured flowable oxide 250. In other words, the negatively-charged liner 240 is located below the top surface of the semiconductor substrate 200.

Figure 2E:
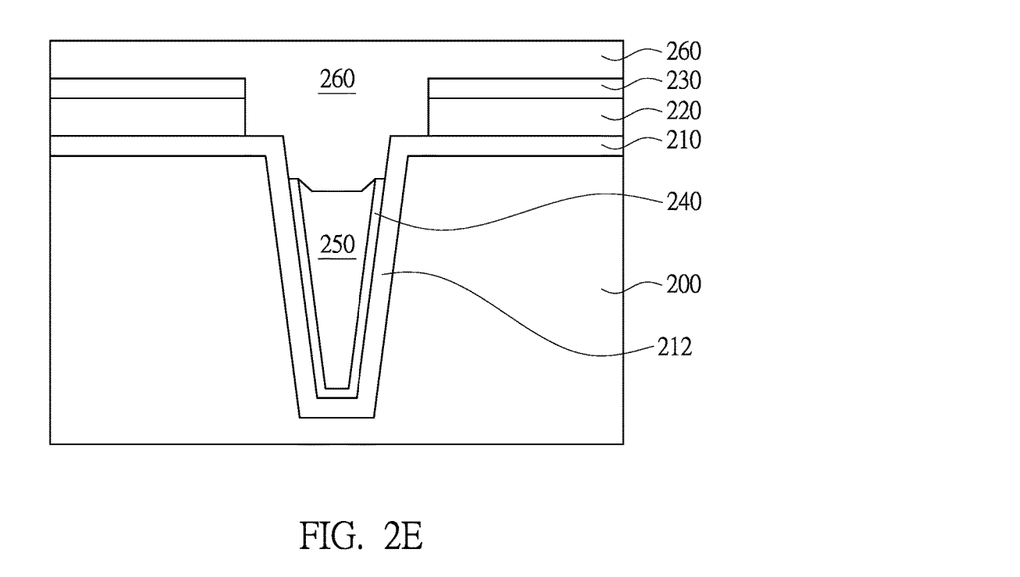

As shown in FIG. 2E, a silicon oxide, such as a HDP oxide 260, is deposited to fill the remaining portion of the trench 202 until a top surface of the HDP oxide 260 is higher than a top surface of the SRO layer 230. In some embodiments, the operation of depositing the HDP oxide 260 in the remaining portion of the trench 202 adopts a HDPCVD process. The aspect ratio of the remaining portion of the trench 202 is much smaller than that of the unfilled trench 202, and thus only a low aspect ratio process is needed, for example, a low power HDPCVD process, thereby avoiding plasma damages.

Figure 2F:
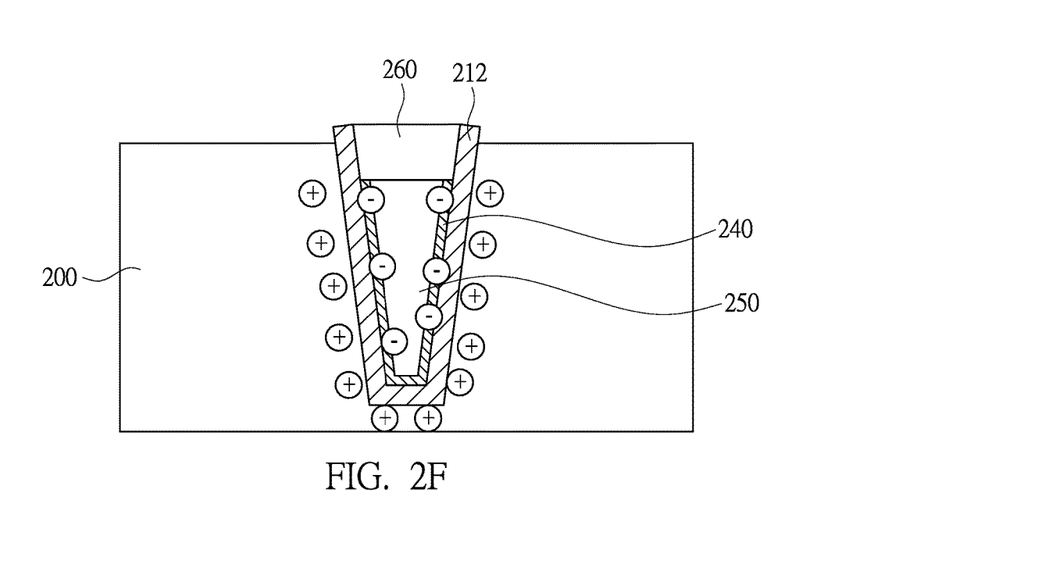

As shown in FIG. 2F, a planarization process, such as a chemical mechanical polish (CMP) process, is performed to remove excess portions of the silicon oxide over the top surface of the semiconductor substrate 200. After the planarization process, the HDP oxide 260, the SRO layer 230, the silicon nitride layer 220 and the pad oxide layer 210 above the top surface of the semiconductor substrate 200 are removed, and the semiconductor device similar to that shown in FIG. 1A is formed. Because the HDP oxide 260 and the lining oxide layer 212 are harder than the pad oxide layer 210, small portions of the HDP oxide 260 and the lining oxide layer 212 are left above the top surface of the semiconductor substrate 200. In some embodiments, the thickness of the remaining HDP oxide 260 ranges from about 100 Angstroms to about 550 Angstroms, and the thickness of the remaining lining oxide layer 212 ranges from about 10 Angstroms to about 150 Angstroms.

In some embodiments, when the negatively-charged liner 240 is negatively-charged silicon nitride, because the exposed negatively-charged silicon nitride does not cause metal contaminations in the subsequent processes, the negatively-charged liner 240 above a surface of the cured flowable oxide 250 does not need to be removed, and can be left in the upper part of the trench 202, and the semiconductor device similar to that shown in FIG. 1D is formed.

FIG. 3A-FIG. 3F are schematic cross-sectional views of intermediate stages showing a method for fabricating a semiconductor device in accordance with some embodiments. The processing methods used in FIG. 3A-FIG. 3F are similar to those in FIG. 2A-FIG. 2F, and are repeated again.

Figure 3A:
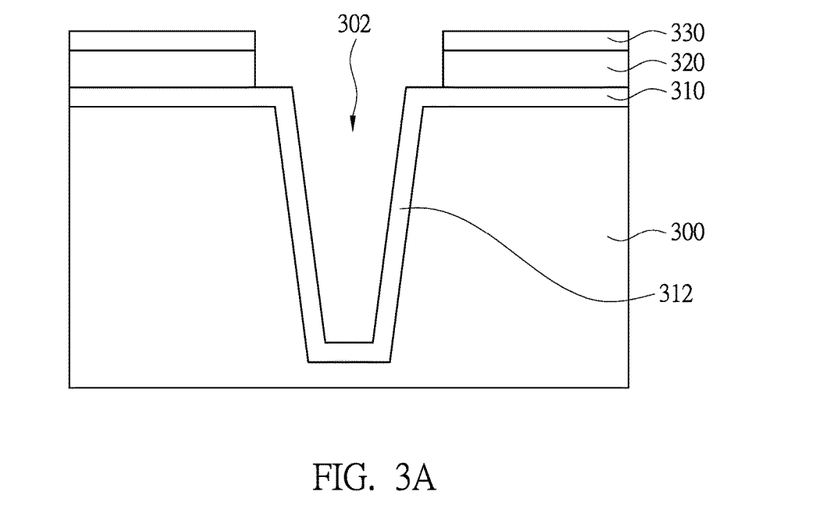
FIG. 3A-FIG. 3F are schematic cross-sectional views of intermediate stages showing a method for fabricating a semiconductor device in accordance with certain embodiments.

As shown in FIG. 3A, a semiconductor substrate 300 is provided, and a pad oxide layer 310, a silicon nitride layer 320 and a SRO layer 330 are sequentially stacked on the semiconductor substrate 300. After the semiconductor substrate 300 is etched to form a trench 302, a lining oxide layer 312 is formed conformal to the trench 302 and adjoins the pad oxide layer 310.

Figure 3B:
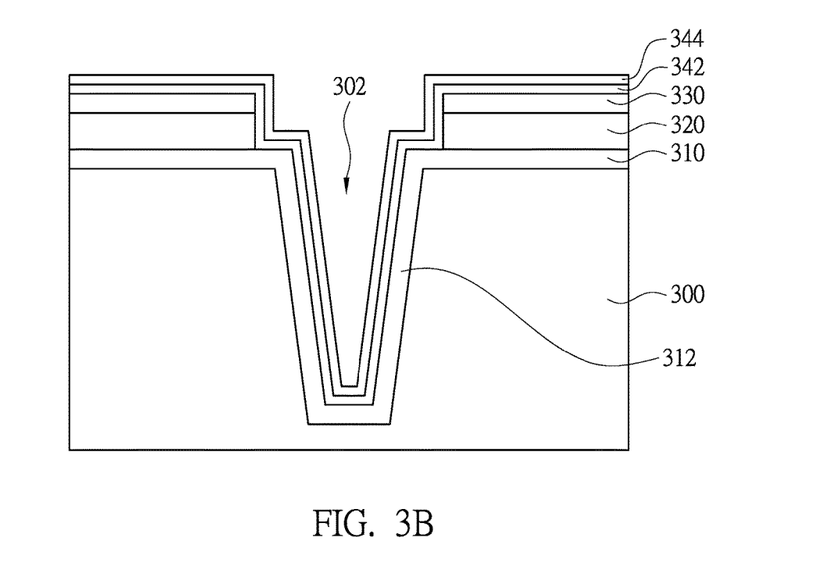
Figure 3C:
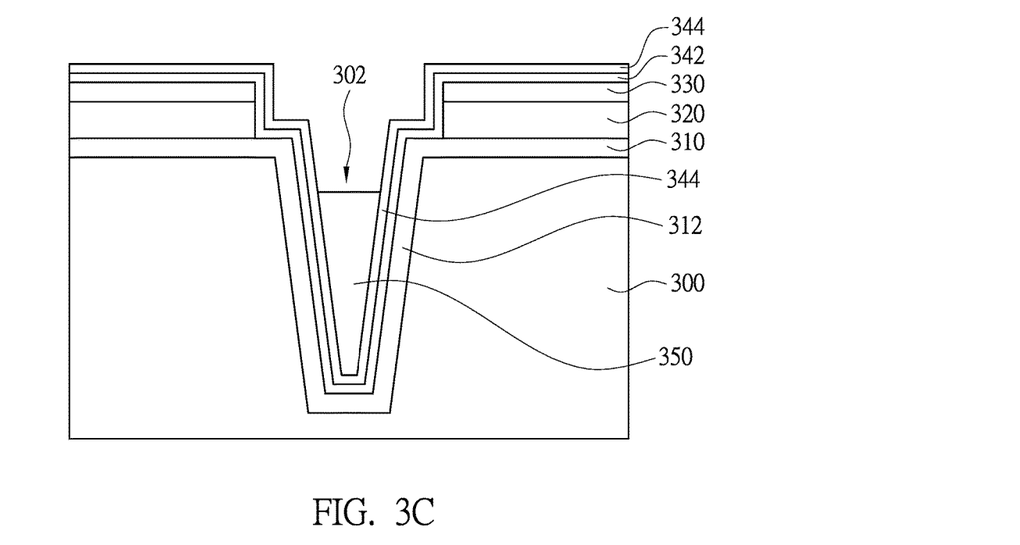

As shown in FIG. 3B, a negative charge liner 342, such as negatively-charged silicon nitride, is formed conformal to the trench 302 and covers the lining oxide layer 312, the silicon nitride layer 320 and the SRO layer 330. Then, a high-K dielectric liner 344, such as aluminum oxide or hafnium oxide, is conformal to the trench 302 and to cover the negative charge liner 342. In the present embodiments, the negative charge liner 342 and the high-K dielectric liner 344 enclosed by the negative charge liner 342 are used to replace the negatively-charged liner 240 shown in FIG. 2B. As shown in FIG. 3C, the trench 302 is partially filled with a flowable oxide 350 to a level below a top surface of the semiconductor substrate 300. After being deposited in the trench 302, the flowable oxide 340 is cured at a temperature ranging from about 600° C. to about 1000° C., to convert the flowable oxide to silicon oxide.

Figure 3D:
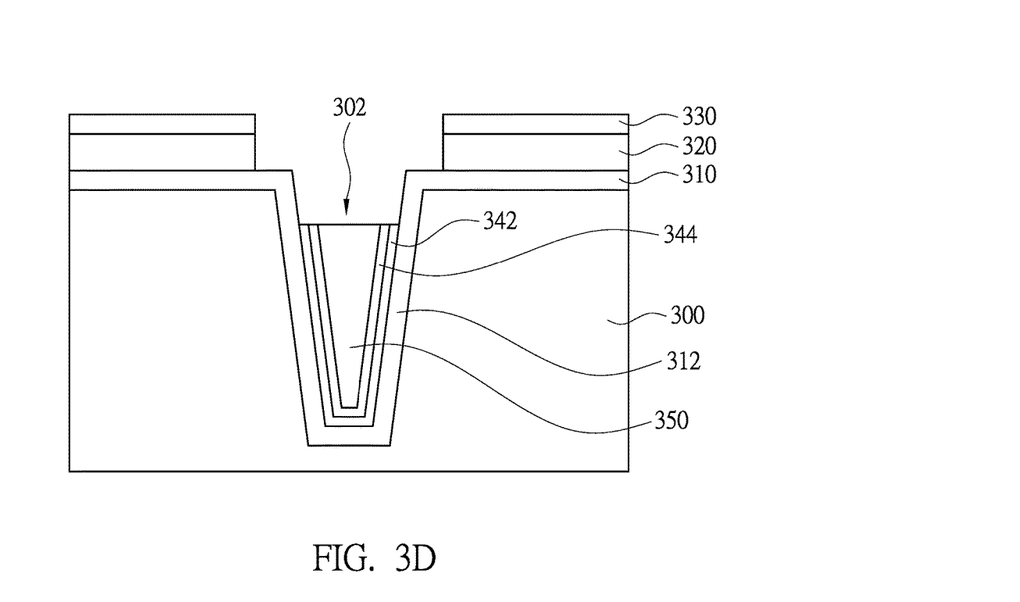

As shown in FIG. 3D, the negative charge liner 342 and the high-K dielectric liner 344 above a surface of the cured flowable oxide 350 are removed, for example, by selectively etching. After the selectively etching, the negative charge liner 342 and the high-K dielectric liner 344 only exist in a lower part of the trench 302, and are covered by the cured flowable oxide 350. In other words, the negative charge liner 342 and the high-K dielectric liner 344 are located below the top surface of the semiconductor substrate 300.

Figure 3E:
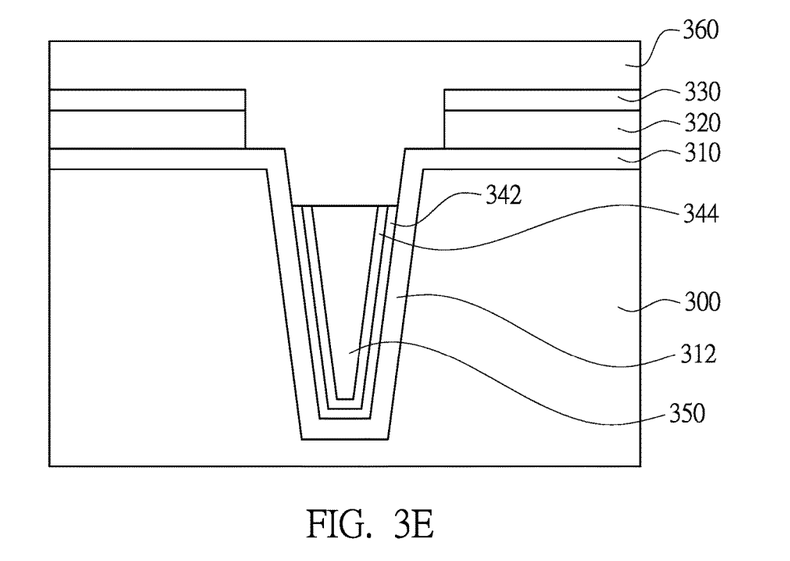
Figure 3F:
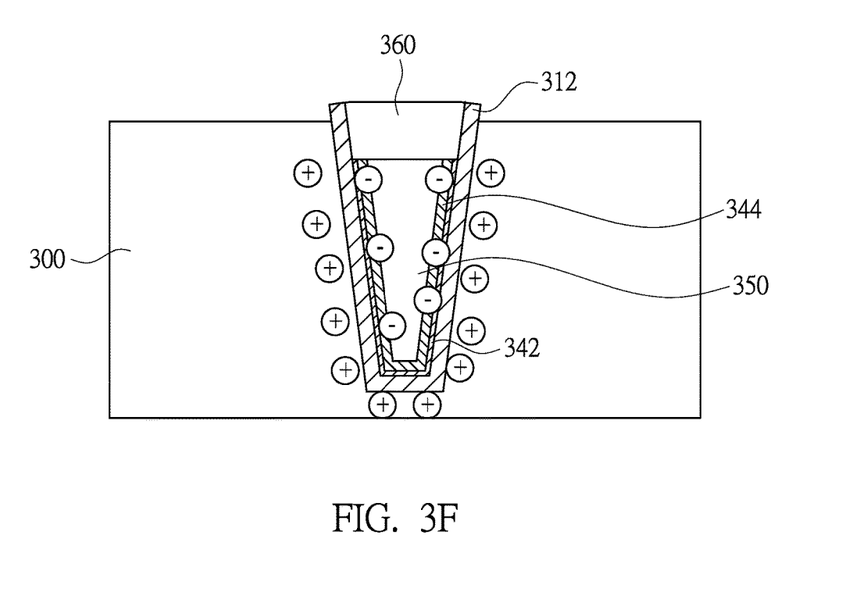

As shown in FIG. 3E, a silicon oxide, such as a HDP oxide 360, is deposited to fill the remaining portion of the trench 302 until a top surface of the HDP oxide 360 is higher than a top surface of the SRO layer 330. As shown in FIG. 3F, a planarization process, such as a chemical mechanical polish (CMP) process, is performed to remove excess portions of the silicon oxide over the top surface of the semiconductor substrate 300. After the planarization process, the HDP oxide 360, the SRO layer 330, the silicon nitride layer 320 and the pad oxide layer 310 above the top surface of the semiconductor substrate 200 are removed, and the semiconductor device similar to that shown in FIG. 1B is formed.

In some embodiments, when the negative charge liner 342 is negatively-charged silicon nitride, because the exposed negatively-charged silicon nitride does not cause metal contaminations in the subsequent processes, the negative charge liner 342 above a surface of the cured flowable oxide 350 does not need to be removed, and can be left in the upper part of the trench 302, and the semiconductor device similar to that shown in FIG. 1E is formed.

Figure 4:
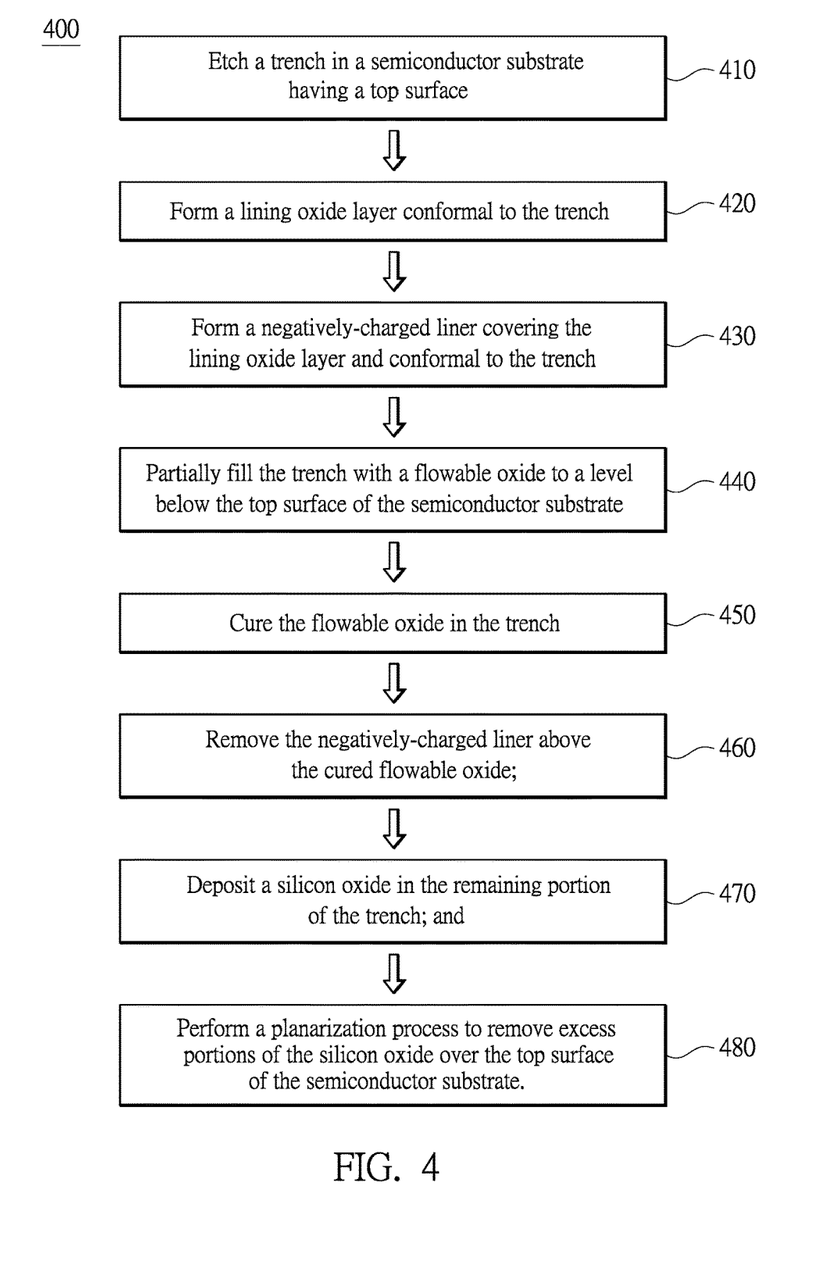
FIG. 4 is a flow chart of a method for fabricating a semiconductor device in accordance with various embodiments.

Referring to FIG. 4 with FIG. 2A-FIG. 2F, FIG. 4 is a flow chart of a method 400 for fabricating a semiconductor device in accordance with various embodiments. The method 400 begins at operation 410, where a trench 202 is etched in a semiconductor substrate 200 having a top surface, as shown in FIG. 2A. At operation 420, a lining oxide layer 212 is formed conformal to the trench 202. At operation 430, a negatively-charged liner 212 conformal to the trench is formed, and covers the lining oxide layer 212, as shown in FIG. 2B. At operation 440, the trench 202 is partially filled with a flowable oxide 250 to a level below the top surface of the semiconductor substrate 200, as shown in FIG. 2C. At operation 450, the flowable oxide 250 in the trench 202 is cured. At operation 460, the negatively-charged liner 240 above the cured flowable oxide 450 is removed, as shown in FIG. 2D. However, when the negatively-charged liner 240 is negatively-charged silicon nitride, because the exposed negatively-charged silicon nitride does not cause metal contaminations in the subsequent processes, the negatively-charged liner 240 above a surface of the cured flowable oxide 250 does not need to be removed, and can be left in the upper part of the trench 202. At operation 470, a silicon oxide 260 is deposited in the remaining portion of the trench, as shown in FIG. 2E. At operation 480, a planarization process is performed to remove excess portions of the silicon oxide 260 over the top surface of the semiconductor substrate 200.

Figure 5:
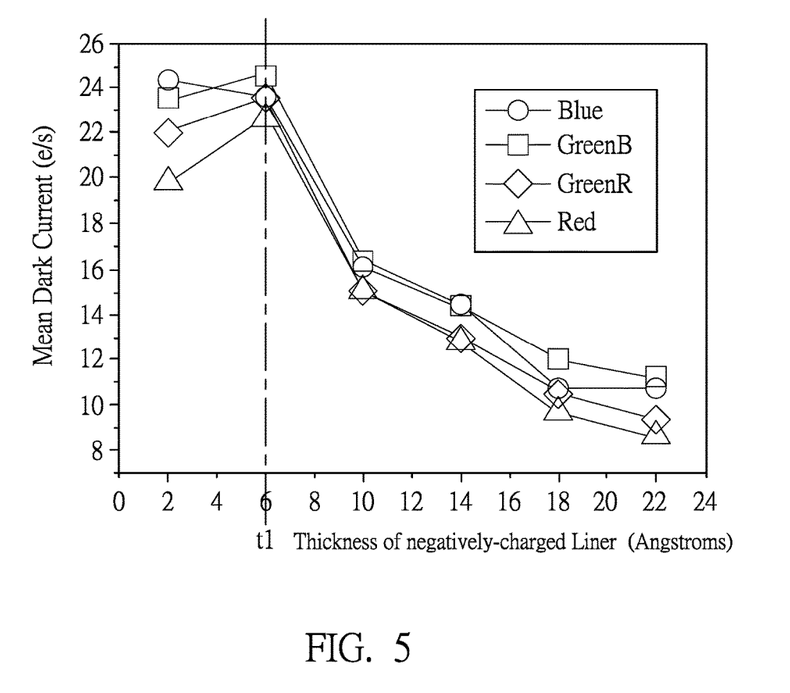
FIG. 5 is a graph showing the relationship between mean dark current and thickness of the negatively-charged liner in accordance with some embodiments.

FIG. 5 is a graph showing the relationship between mean dark current and thickness of the negatively-charged liner in accordance with some embodiments. As shown in FIG. 5, when the thickness of the negatively-charged liner is smaller than t1, the mean dark current is not reduced with the increase of the thickness of the negatively-charged liner. When the thickness of the negatively-charged liner is greater than t1, the mean dark current is greatly reduced with the increase of the thickness of the negatively-charged liner. When the thickness of the negatively-charged liner reaches a certain thickness value, the mean dark current is decreased slowly with the increase of the thickness of the negatively-charged liner.

In accordance with some embodiments, the present disclosure discloses a semiconductor device including a semiconductor substrate and a trench isolation. The trench isolation is located in the semiconductor substrate, and includes a bottom portion and a top portion. The bottom portion has a lining oxide layer, a negatively-charged liner and a first silicon oxide. The lining oxide layer is peripherally enclosed by the semiconductor substrate, the negatively-charged liner is peripherally enclosed by the lining oxide layer, and the first silicon oxide is peripherally enclosed by the negatively-charged liner. The top portion adjoins the bottom portion, and has a second silicon oxide peripherally enclosed by the semiconductor substrate.

In accordance with certain embodiments, the present disclosure disclosed a method for fabricating a semiconductor device. In this method, a trench is etched in a semiconductor substrate having a top surface, and a lining oxide layer is formed conformal to the trench. A negatively-charged liner covering the lining oxide layer and conformal to the trench is formed. The trench is partially filled with a flowable oxide to a level below the top surface of the semiconductor substrate, and the flowable oxide in the trench is cured. The negatively-charged liner above the cured flowable oxide is optionally removed. A silicon oxide is deposited in the remaining portion of the trench, and a planarization process is performed to remove excess portions of the silicon oxide over the top surface of the semiconductor substrate.

In accordance with certain embodiments, the present disclosure disclosed a method for fabricating a semiconductor device. In this method, a semiconductor substrate is provided. A pad oxide layer, a silicon nitride layer and a silicon-rich oxide (SRO) layer are sequentially formed on the semiconductor substrate. A trench is etched in a semiconductor substrate having a top surface. A lining oxide layer that is conformal to the trench and adjoins the pad oxide layer is formed. A negatively-charged silicon nitride that is conformal to the trench and covers the lining oxide layer, the silicon nitride layer and the SRO layer is formed. A high-K dielectric liner that is conformal to the trench and covers the negative charge liner is formed. The trench is partially filled with a flowable oxide to a level below the top surface of the semiconductor substrate. The flowable oxide in the trench is cured. A silicon oxide is deposited in the remaining portion of the trench. A planarization process is performed to remove excess portions of the silicon oxide, the SRO layer, the silicon nitride layer and the pad oxide layer over the top surface of the semiconductor substrate.

In accordance with certain embodiments, the present disclosure disclosed a method for fabricating a semiconductor device. In this method, a semiconductor substrate is provided. A pad oxide layer, a silicon nitride layer and a silicon-rich oxide (SRO) layer are sequentially formed on the semiconductor substrate. A trench is etched in a semiconductor substrate having a top surface. A lining oxide layer that is conformal to the trench and adjoins the pad oxide layer is formed. A negatively-charged silicon nitride that is conformal to the trench and covers the lining oxide layer, the silicon nitride layer and the SRO layer is formed. A high-K dielectric liner that is conformal to the trench and covers the negative charge liner is formed. The trench is partially filled with a flowable oxide to a level below the top surface of the semiconductor substrate. The flowable oxide in the trench is cured. The high-K dielectric liner above a surface of the cured flowable oxide is selectively etched. A silicon oxide is deposited in the remaining portion of the trench. A planarization process is performed to remove excess portions of the silicon oxide, the negatively-charged silicon nitride, the SRO layer, the silicon nitride layer and the pad oxide layer over the top surface of the semiconductor substrate.

Although the present embodiments and their advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for fabricating a semiconductor device, the method comprising:
   etching a trench in a semiconductor substrate having a top surface;
   forming a lining oxide layer conformal to the trench;
   forming a silicon nitride layer above the lining oxide and above the top surface of the semiconductor substrate;
   forming a silicon-rich oxide (SRO) layer above the silicon nitride layer;
   forming a negative charge liner covering the lining oxide layer and the SRO layer and conformal to the trench; and
   filling the trench with a first oxide.

2. The method of claim 1, wherein forming the negative charge liner comprises depositing the negative charge liner using a low temperature plasma assisted radical oxidation process, an atomic layer deposition process, or a plasma-assisted nitridation process.

3. The method of claim 1, further comprising:
   curing the first oxide; and
   after curing the first oxide, removing the negative charge liner above the first oxide.

4. The method of claim 1, wherein the semiconductor device is an image sensor or a logic device.

5. The method of claim 1, wherein filling the trench with the first oxide includes partially filling the trench with a flowable oxide to a level below the top surface of the semiconductor substrate, the method further comprising:
   curing the flowable oxide;
   depositing a second oxide in the remaining portion of the trench; and
   performing a planarization process to remove the second oxide, the SRO layer, and the silicon nitride layer over the top surface of the semiconductor substrate.

6. The method of claim 5, wherein partially filling the trench with the flowable oxide comprises filling the trench with the flowable oxide using a spin on glass (SOG) or flowable chemical vapor deposition (FCVD) process.

7. The method of claim 5, wherein depositing the second oxide in the remaining portion of the trench comprises depositing the second oxide using a high density plasma chemical vapor deposition (HDPCVD) process.

8. The method of claim 5, wherein the planarization process is a chemical mechanical polish (CMP) process.

9. A method for fabricating a semiconductor device, the method comprising:
   etching a trench in a semiconductor substrate;
   forming a lining oxide layer that is conformal to the trench;
   sequentially forming a silicon nitride layer and a silicon-rich oxide (SRO) layer on a top surface of the semiconductor substrate;
   forming a negative charge liner that is conformal to the trench and that covers the lining oxide layer, the silicon nitride layer, and the SRO layer;
   forming a high-K dielectric liner that is conformal to the trench and that covers the negative charge liner;
   partially filling the trench with a first oxide to a level below the top surface of the semiconductor substrate;
   depositing a first oxide to a level below the top surface of the semiconductor substrate;
   curing the flowable oxide in the trench;
   depositing a silicon second oxide in the remaining portion of the trench; and performing a planarization process to remove the second oxide, the SRO layer, and the silicon nitride layer over the top surface of the semiconductor substrate.

10. The method of claim 9, wherein forming the high-K dielectric liner comprises depositing the high-K dielectric liner using an atomic layer deposition (ALD) process.

11. The method of claim 9, wherein forming the negative charge liner comprises depositing the negative charge liner using reaction gas of silane ($SiH_4$) and ammonia ($NH_3$) and using a low temperature plasma assisted radical oxidation process, an atomic layer deposition process, or a plasma-assisted nitridation process.

12. The method of claim 9, further comprising:
   curing the first oxide; and
   after curing the first oxide, selectively etching the high-K dielectric liner above a surface of the first oxide.

13. The method of claim 9, wherein partially filling the trench with the first oxide comprises filling the trench with a flowable oxide using a spin on glass (SOG) or flowable chemical vapor deposition (FCVD) process.

14. The method of claim 9, wherein depositing the second oxide in the remaining portion of the trench comprises depositing the second oxide using a high density plasma chemical vapor deposition (HDPCVD) process.

15. The method of claim 9, wherein the planarization process is a chemical mechanical polish (CMP) process.

16. A method for fabricating a semiconductor device, the method comprising:
   providing a semiconductor substrate;
   etching a trench in the semiconductor substrate;
   forming a lining oxide layer that is conformal to the trench;
   sequentially forming a silicon nitride layer and a silicon-rich oxide (SRO) layer on a top surface of the semiconductor substrate;
   forming a negative charge liner that is conformal to the trench and that covers the lining oxide layer, the silicon nitride layer, and the SRO layer;
   forming a high-K dielectric liner that is conformal to the trench and that covers the negative charge liner;
   filling the trench with a first oxide; and
   performing a planarization process to remove the nitride negative charge liner, the SRO layer, and the silicon nitride layer over the top surface of the semiconductor substrate.

17. The method of claim 16, wherein forming the negative charge liner comprises depositing the negative charge liner using reaction gas of silane ($SiH_4$) and ammonia ($NH_3$) and using a low temperature plasma assisted radical oxidation process, an atomic layer deposition process, or a plasma-assisted nitridation process.

18. The method of claim 16, wherein filling the trench with the first oxide includes partially filling the trench with a flowable oxide to a level below the top surface of the semiconductor substrate, the method further comprising:
   curing the flowable oxide;
   after curing the flowable oxide, selectively etching the high-K dielectric liner above a surface of the flowable oxide; and
   depositing a second oxide in the remaining portion of the trench, wherein performing the planarization process includes removing the second oxide over the top surface of the semiconductor substrate.

19. The method of claim 18, wherein selectively etching the high-K dielectric liner is performed using a dry etching that involves boron trichloride in argon.

20. The method of claim 18, wherein partially filling the trench with the flowable oxide comprises filling the trench with the flowable oxide using a spin on glass (SOG) or flowable chemical vapor deposition (FCVD) process, and depositing the second oxide in the remaining portion of the trench comprises depositing the second oxide using a high density plasma chemical vapor deposition (HDPCVD) process.

* * * * *